(12) United States Patent
Sonoda et al.

(10) Patent No.: US 9,093,646 B2
(45) Date of Patent: Jul. 28, 2015

(54) VAPOR DEPOSITION METHOD AND METHOD FOR MANUFACTURING ORGANIC ELECTROLUMINESCENT DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 22 days.

(21) Appl. No.: 13/992,613

(22) PCT Filed: Dec. 7, 2011

(86) PCT No.: PCT/JP2011/078328
§ 371 (c)(1),
(2), (4) Date: Jun. 7, 2013

(87) PCT Pub. No.: WO2012/081476
PCT Pub. Date: Jun. 21, 2012

(65) Prior Publication Data
US 2013/0260499 A1 Oct. 3, 2013

(30) Foreign Application Priority Data
Dec. 14, 2010 (JP) .................................. 2010-278500

(51) Int. Cl.
*H01L 51/00* (2006.01)
*C23C 14/24* (2006.01)
(Continued)

(52) U.S. Cl.
CPC ............ *H01L 51/0008* (2013.01); *C23C 14/24* (2013.01); *C23C 14/243* (2013.01); *C23C 14/246* (2013.01); *C23C 14/568* (2013.01); *H01L 27/3211* (2013.01); *H01L 51/56* (2013.01)

(58) Field of Classification Search
None
See application file for complete search history.

(56) References Cited

U.S. PATENT DOCUMENTS 5,742,129 A 4/1998 Nagayama et al.
6,294,892 B1 9/2001 Utsugi et al.
(Continued)

FOREIGN PATENT DOCUMENTS

JP 8-227276 A 9/1996
JP 2000-188179 A 7/2000
(Continued)

OTHER PUBLICATIONS

International Search Report received for PCT Patent Application No. PCT/JP2011/078328, mailed on Jan. 31, 2012, 2 pages (1 page of English Translation and 1 page of PCT Search Report).

*Primary Examiner* — Charles Garber
*Assistant Examiner* — Alia Sabur
(74) *Attorney, Agent, or Firm* — Morrison & Foerster LLP

(57) ABSTRACT

A vapor deposition device (50) in accordance with the present invention is a vapor deposition device for forming a film on a film formation substrate (60), including: a vapor deposition source (91) which has a plurality of injection holes (92) from which vapor deposition particles are to be injected towards the film formation substrate (60), the plurality of injection holes (92) being arranged in a line or in a plurality of lines; a vapor deposition crucible (93) for supplying the vapor deposition particles to the vapor deposition source (91) via a pipe (94), the pipe being connected to the vapor deposition source (91) on a side where one end of the line(s) of the plurality of injection holes (92) is located; moving means for moving the film formation substrate (60) relative to the vapor deposition source(s) (91); and a rotation mechanism (100) for rotating the vapor deposition source (91).

4 Claims, 10 Drawing Sheets

(51) Int. Cl.
*C23C 14/56* (2006.01)
*H01L 27/32* (2006.01)
*H01L 51/56* (2006.01)

(56) References Cited

U.S. PATENT DOCUMENTS

| | | | | |
|---|---|---|---|---|
| 6,656,284 | B1 * | 12/2003 | Hwang et al. | 118/715 |
| 6,812,157 | B1 * | 11/2004 | Gadgil | 438/763 |
| 2002/0043216 | A1 * | 4/2002 | Hwang et al. | 118/723 VE |
| 2006/0090705 | A1 * | 5/2006 | Kim | 118/726 |
| 2007/0266943 | A1 * | 11/2007 | Yeh et al. | 118/721 |
| 2008/0277658 | A1 * | 11/2008 | Lee et al. | 257/43 |

FOREIGN PATENT DOCUMENTS

| | | |
|---|---|---|
| JP | 2002-249868 A | 9/2002 |
| JP | 2004-018997 A | 1/2004 |
| JP | 2005-293968 A | 10/2005 |
| WO | 2010/035130 A2 | 4/2010 |

* cited by examiner

VAPOR DEPOSITION METHOD AND METHOD FOR MANUFACTURING ORGANIC ELECTROLUMINESCENT DISPLAY DEVICE

CROSS REFERENCE TO RELATED APPLICATIONS

This is a U.S. National Phase patent application of PCT/JP2011/078328, filed Dec. 7, 2011, which claims priority to Japanese patent application no. 2010-278500, filed Dec. 14, 2010, each of which is hereby incorporated by reference in the present disclosure in its entirety.

TECHNICAL FIELD

The present invention relates to (i) a vapor deposition device (vapor deposition apparatus) and (ii) a vapor deposition method each employing a vacuum deposition method, and (iii) a method for producing an organic electroluminescent display device with use of the vapor deposition device by the vapor deposition method.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT. The organic EL layer between the first electrode and the second electrode is an organic layer including a stack of layers such as a hole injection layer, a hole transfer layer, an electron blocking layer, a luminescent layer, a hole blocking layer, an electron transfer layer, and an electron injection layer.

For example, a full-color organic EL display device typically includes, as sub-pixels aligned on a substrate, organic EL elements including luminescent layers of red (R), green (G), and blue (B). The full-color organic EL display device carries out a color image display by, with use of TFTs, selectively causing the organic EL elements to each emit light with a desired luminance.

In order to produce an organic EL display device, it is therefore necessary to form, for each organic EL element, a luminescent layer of a predetermined pattern made of an organic luminescent material which emits light of the colors. A layer that is not required to be patterned in shapes for respective organic EL elements is formed collectively in an entire pixel region constituted by the organic EL elements.

Such formation of a luminescent layer of a predetermined pattern is performed by a method such as (i) a vacuum vapor deposition method, (ii) an inkjet method, and (iii) a laser transfer method. The production of, for example, a low-molecular organic EL display (OLED) often uses a vacuum vapor deposition method (e.g. Patent Literatures 1 and 2).

The vacuum vapor deposition method uses a mask (also called a vapor deposition mask or a shadow mask) provided with openings of a predetermined pattern. The mask is fixed in close contact with a vapor-deposited surface of a substrate which vapor-deposited surface faces a vapor deposition source. Then, vapor deposition particles (film formation material) are injected from the vapor deposition source so as to be deposited on the vapor-deposited surface through openings of the mask. This forms a thin film of a predetermined pattern. The vapor deposition is carried out for each color of a luminescent layer. This is called "selective vapor deposition".

The following will discuss, with reference to FIGS. 13 and 14, a configuration of a conventional vapor deposition device which employs a vacuum deposition method.

FIG. 13 is a side view schematically illustrating a configuration of a conventional vapor deposition device 250. FIG. 14 is a perspective view schematically illustrating a configuration of a vapor deposition source unit 290 of the vapor deposition device 250.

As shown in FIG. 13, the vapor deposition device 250 is a device to be placed in a vacuum chamber and to form a film on a film formation substrate 260. The vapor deposition device 250 includes a shadow mask 280 and a vapor deposition source unit 290. The vapor deposition source unit 290 includes a vapor deposition source 291 and a vapor deposition source crucible 293, which are secured to a support (not illustrated).

The vapor deposition source 291 has a plurality of injection holes (nozzles) 292 from which vapor deposition particles are injected. The injection holes 292 are arranged in a line as shown in FIG. 14.

The vapor deposition source crucible 293 contains a vapor deposition material which is in solid or liquid form. The vapor deposition material is heated in the vapor deposition source crucible 293 so as to be gaseous vapor deposition particles and supplied (introduced) via a pipe 294 to the vapor deposition source 291. The pipe 294 is connected to the vapor deposition source 291 at an end (supply-side end) where one end of the line of the injection holes 292 is located. The vapor deposition particles thus supplied to the vapor deposition source 291 are injected from the injection holes 292. Note that the pipe 294 is heated to such a temperature that the vapor deposition particles do not adhere to the pipe 294.

The film formation substrate 260 and the vapor deposition source 291 are arranged such that a vapor-deposited surface of the film formation substrate 260 faces the vapor deposition source 291. The shadow mask 280, which has an opening corresponding to a pattern of a vapor deposition region, is attached tightly to the vapor deposited-surface of the film formation substrate 260 so that no vapor deposition particles adhere to a region other than the intended vapor deposition region.

According to the configuration, while the vapor deposition particles are injected from the injection holes 292, the film formation substrate 260 and the shadow mask 280 are moved (scanned) relative to the vapor deposition source 291. This forms a predetermined pattern on the film formation substrate 260.

CITATION LIST

Patent Literatures

Patent Literature 1
Japanese Patent Application Publication, Tokukaihei, No. 8-227276 A (Publication Date: Sep. 3, 1996)
Patent Literature 2
Japanese Patent Application Publication, Tokukai, No. 2000-188179 A (Publication Date: Jul. 4, 2000)

SUMMARY OF INVENTION

Technical Problem

However, the foregoing conventional techniques may cause nonuniformity in distribution of film thickness of a vapor-deposited film.

FIG. 15 is a graph illustrating a relationship between (i) positions on the film formation substrate 260 along a direction in which the injection holes 292 are arranged and (ii) distribution (thickness) of vapor deposition particles. It is assumed in the graph that (i) a position facing a supply-side end of the vapor deposition source 291 is a position A and (ii) a position facing the other end opposite to the supply-side end of the vapor deposition source 291 is a position B.

In the vapor deposition source 291, vapor deposition particles are influenced by pressure difference, internal shapes, and conductance, etc. in supply paths and injection holes. Therefore, different amounts of vapor deposition particles are injected from the injection holes 292. Specifically, since vapor deposition particles are injected sequentially from an injection hole 292 that is close to the supply-side end, density of the vapor deposition particles decreases with increasing distance from the supply-side end. This results in a pressure difference inside the vapor deposition source 291. Therefore, the amount of vapor deposition particles injected from the injection holes 292 decreases with increasing distance from the supply-side end of the vapor deposition source 291. As a result, a vapor-deposited film on the film formation substrate 260, which film is composed of vapor deposition particles injected from various injection holes 292, also includes different amounts of vapor deposition particles depending on the positions on a surface of the substrate (see FIG. 15). This causes nonuniformity in film thickness distribution across the surface of the substrate.

In particular, an organic EL element has a light-emitting property that is highly sensitive to the film thickness of a deposited organic film. Therefore, a variation in the film thickness of the organic film across a screen of an organic EL display device leads directly to display unevenness and nonuniform life property. In view of this, it is preferable to uniformly deposit a luminescent layer of the organic EL element as much as possible.

Note that it is also possible to control the amount of vapor deposition particles to be injected from each injection hole by changing an opening size (diameter) of that injection hole. However, such a control requires high accuracy when making injection holes, and thus leads to an increase in production cost for the vapor deposition source. In addition, the distribution of vapor deposition particles changes dynamically. Therefore, it is difficult to cause vapor deposition particles to be injected from the injection holes in equal amounts only by changing the opening sizes of the injection holes.

Another option is to connect the pipe 294, which is for supplying the vapor deposition particles, to the vapor deposition source 291 at the middle of a longitudinal length of the vapor deposition source 291. However, in this case, density of the vapor deposition particles increases from the position A toward an intermediate position between the position A and the position B, and decreases from the intermediate position toward the position B. Therefore, the distribution is still nonuniform.

The present invention has been made in view of the problems above, and an object of the present invention is to provide a vapor deposition device and a vapor deposition method each of which is capable of vapor deposition of vapor deposition particles on a film formation substrate such that a film made of the vapor deposition particles has a uniform thickness.

Solution to Problem

In order to attain the foregoing object, a vapor deposition device of the present invention is a vapor deposition device for forming a film on a film formation substrate, including: a vapor deposition source which has a plurality of injection holes from which vapor deposition particles are to be injected towards the film formation substrate, the plurality of injection holes being arranged in a line or in a plurality of lines; vapor deposition particle supplying means for supplying the vapor deposition particles to the vapor deposition source via a pipe, the pipe being connected to the vapor deposition source on a side where one end of the line(s) of the plurality of injection holes is located; and rotating means for rotating the vapor deposition source.

In order to attain the foregoing object, a vapor deposition method of the present invention is a vapor deposition method for forming a film on a film formation substrate, including the steps of: (a) supplying, via a pipe, vapor deposition particles to a vapor deposition source which has a plurality of injection holes arranged in a line or in a plurality of lines, the pipe being connected to the vapor deposition source on a side where one end of the line(s) of the plurality of injection holes is located; (b) injecting the vapor deposition particles from the injection holes towards the film formation substrate; (c) rotating, after the step (b), the vapor deposition source so as to reverse a direction in which the plurality of injection holes are arranged; and (d) injecting, after the step (c), the vapor deposition particles from the injection holes towards the film formation substrate.

According to the vapor deposition device and the vapor deposition method, the vapor deposition particles are supplied to the vapor deposition source via the pipe from the vapor deposition particle supplying means, and injected from the injection holes towards the film formation substrate. Since the pipe is connected to the vapor deposition source on the side where one end of the line(s) of the injection holes is located, the amount of vapor deposition particles to be injected from the injection holes monotonically decreases with increasing distance from the one end. In view of the circumstances, after vapor deposition particles are injected from the injection holes towards the film formation substrate, the vapor deposition source is rotated so that the direction in which the injection holes are arranged is reversed, and then vapor deposition particles are injected from the injection holes towards the film formation substrate again. With this, film thickness distribution of vapor deposition particles deposited before the reverse and that after the reverse are symmetrical about the center of the substrate. Accordingly, film thickness distribution which is a combination of (a) the film thickness distribution of vapor deposition particles deposited before the reverse and (b) the film thickness distribution of vapor deposition particles deposited after the reverse is more uniform than that obtained in a case where the vapor deposition is carried out without rotating the vapor deposition source. As such, it is possible to provide a vapor deposition device and a vapor deposition method each of which is capable of vapor deposition of vapor deposition particles on a film formation substrate such that a film made of the vapor deposition particles has a uniform thickness.

A method for producing an organic electroluminescent display device of the present invention includes the steps of: (A) forming a first electrode on a TFT substrate; (B) depositing, over the TFT substrate, an organic layer including at least a luminescent layer; (C) depositing a second electrode; and (D) sealing, with a sealing member, an organic electroluminescent element including the organic layer and the second electrode, at least one of the steps (B), (C) and (D) including the steps (a), (b), (c) and (d) of the above vapor deposition method.

According to the arrangement, it is possible, by a vapor deposition method of the present invention, to form an organic layer or the like having a uniform film thickness. This makes it possible to provide an organic electroluminescent display device which causes less display unevenness.

Advantageous Effects of Invention

As described above, a vapor deposition device of the present invention is a vapor deposition device for forming a film on a film formation substrate, including: a vapor deposition source which has a plurality of injection holes from which vapor deposition particles are to be injected towards the film formation substrate, the plurality of injection holes being arranged in a line or in a plurality of lines; vapor deposition particle supplying means for supplying the vapor deposition particles to the vapor deposition source via a pipe, the pipe being connected to the vapor deposition source on a side where one end of the line(s) of the plurality of injection holes is located; and rotating means for rotating the vapor deposition source. Furthermore, a vapor deposition method of the present invention is a vapor deposition method for forming a film on a film formation substrate, including the steps of: (a) supplying, via a pipe, vapor deposition particles to a vapor deposition source which has a plurality of injection holes arranged in a line or in a plurality of lines, the pipe being connected to the vapor deposition source on a side where one end of the line(s) of the plurality of injection holes is located; (b) injecting the vapor deposition particles from the injection holes towards the film formation substrate; (c) rotating, after the step (b), the vapor deposition source so as to reverse a direction in which the injection holes are arranged; and (d) injecting, after the step (c), the vapor deposition particles from the injection holes towards the film formation substrate. This makes it possible to provide a vapor deposition device and a vapor deposition method each of which is capable of vapor deposition of vapor deposition particles on a film formation substrate such that a film made of the vapor deposition particles has a uniform film thickness.

DESCRIPTION OF EMBODIMENTS

Embodiments of the present invention are described below in detail.

Embodiment 1

An embodiment of the present invention is described below with reference to FIGS. 1 through 9.

The present embodiment describes, as an example vapor deposition method involving a vapor deposition device of the present embodiment, a method for producing an organic EL display device that (i) is of a bottom emission type, that is, extracts light from a TFT substrate side, and that (ii) carries out an RGB full color display.

The description first deals with the overall configuration of the organic EL display device.

Figure 6:
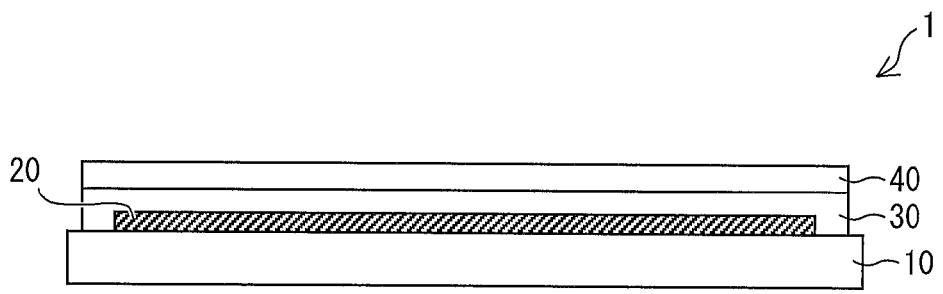
FIG. 6 is a cross-sectional view schematically illustrating a configuration of an organic EL display device for carrying out an RGB full-color display.
Figure 7:
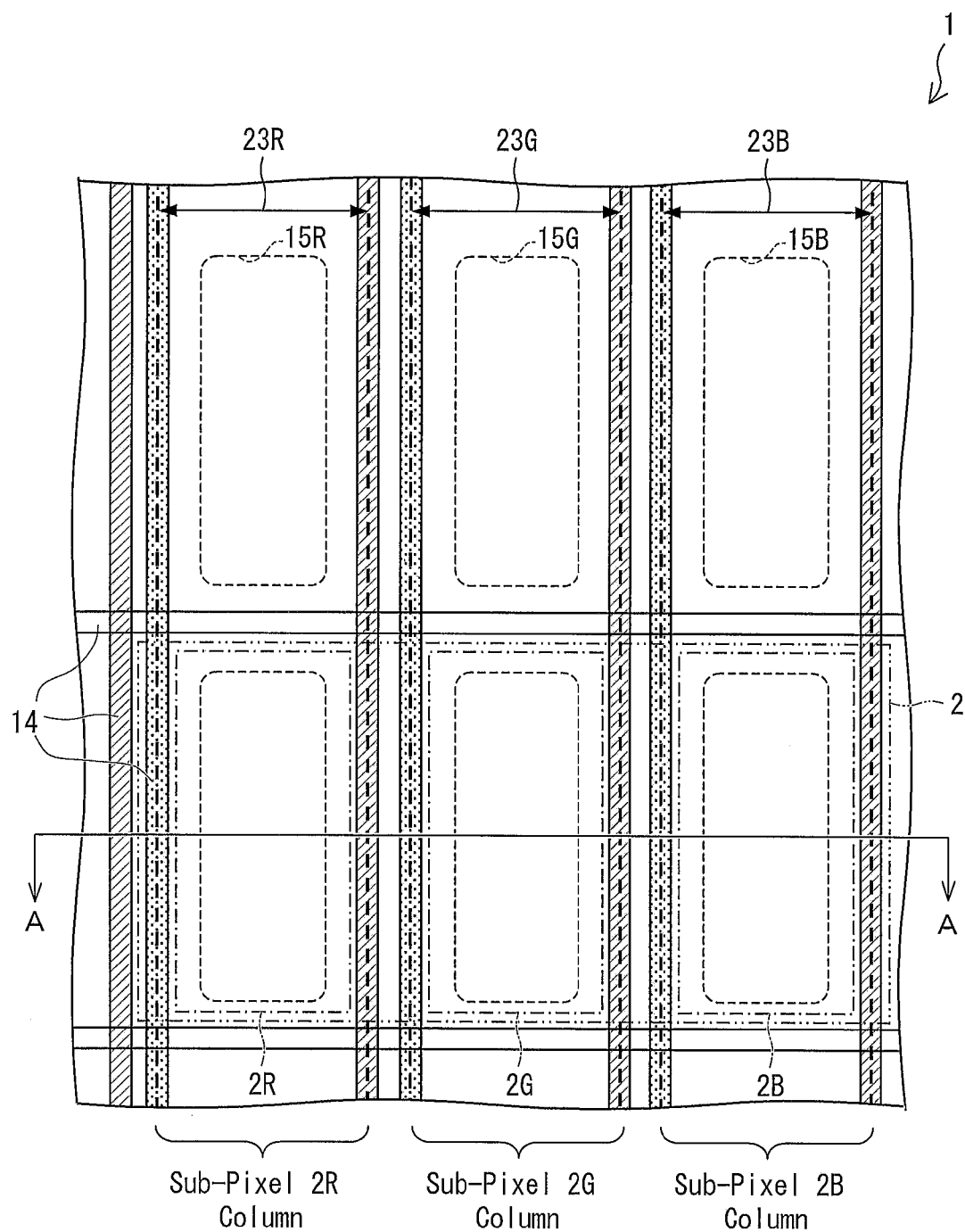
FIG. 7 is a plan view illustrating configurations of pixels constituting the organic EL display device shown in FIG. 6.
Figure 8:
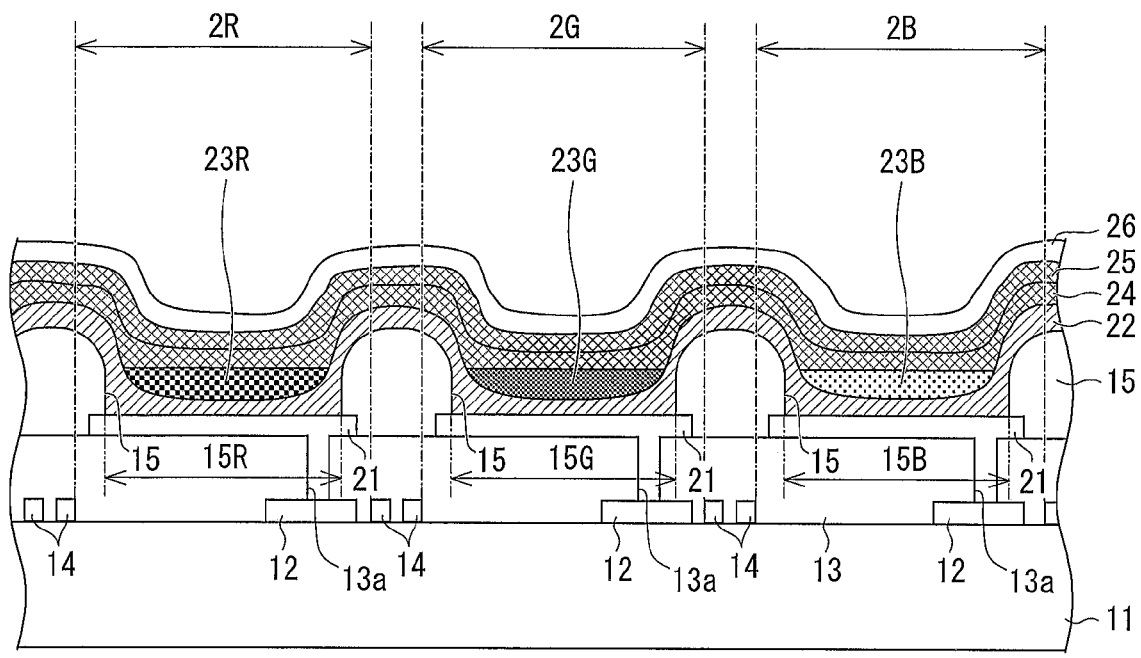
FIG. 8 is a cross-sectional view (taken along the line A-A) of a TFT substrate of the organic EL display device shown in FIG. 7.

FIG. 6 is a cross-sectional view schematically illustrating a configuration of the organic EL display device that carries out an RGB full color display. FIG. 7 is a plan view illustrating an arrangement of pixels included in the organic EL display device illustrated in FIG. 6. FIG. 8 is a cross-sectional view, taken along the line A-A in FIG. 7, of a TFT substrate included in the organic EL display device illustrated in FIG. 7.

As illustrated in FIG. 6, the organic EL display device 1 produced in the present embodiment includes: a TFT substrate 10 including TFTs 12 (see FIG. 8); organic EL elements 20 provided on the TFT substrate 10 and connected to the TFTs 12; an adhesive layer 30; and a sealing substrate 40 arranged in that order.

The organic EL elements 20, as illustrated in FIG. 6, are contained between the TFT substrate 10 and the sealing substrate 40 by attaching the TFT substrate 10, on which the organic EL elements 20 are provided, to the sealing substrate 40 with use of the adhesive layer 30.

The organic EL display device 1, in which the organic EL elements 20 are contained between the TFT substrate 10 and the sealing substrate 40 as described above, prevents infiltration of oxygen, moisture and the like present outside into the organic EL elements 20.

As illustrated in FIG. 8, the TFT substrate 10 includes, as a supporting substrate, a transparent insulating substrate 11 such as a glass substrate. The insulating substrate 11 is, as illustrated in FIG. 7, provided with a plurality of wires 14 including (i) a plurality of gate lines laid in the horizontal direction and (ii) a plurality of signal lines laid in the vertical direction and intersecting with the gate lines. The gate lines are connected to a gate line driving circuit (not shown in the drawings) that drives the gate lines, whereas the signal lines are connected to a signal line driving circuit (not shown in the drawings) that drives the signal lines.

The organic EL display device 1 is a full-color, active matrix organic EL display device. The organic EL display device 1 includes, on the insulating substrate 11 and in regions defined by the wires 14, sub-pixels 2R, 2G, and 2B arranged in a matrix which include organic EL elements 20 of red (R), green (G), and blue (B), respectively.

In other words, the regions defined by the wires 14 each (i) correspond to a single sub-pixel (dot) and (ii) provide a luminescent region of R, G, or B for each sub-pixel.

A pixel 2 (that is, a single pixel) that includes three sub-pixels: a red sub-pixel 2R transmitting red light; a green sub-pixel 2G transmitting green light; and a blue sub-pixel 2B transmitting blue light.

The sub-pixels 2R, 2G, and 2B include, as luminescent regions of the respective colors which luminescent regions perform light emission of the respective sub-pixels 2R, 2G, and 2B, openings 15R, 15G, and 15B that are covered respectively by stripe-shaped luminescent layers 23R, 23G, and 23B of the respective colors.

The luminescent layers 23R, 23G, and 23B are each formed in a pattern by vapor deposition. The openings 15R, 15G, and 15B are described below in detail.

The sub-pixels 2R, 2G, and 2B include respective TFTs 12 each connected to a first electrode 21 of a corresponding one of the organic EL elements 20. The sub-pixels 2R, 2G, and 2B each have an emission intensity that is determined by scan through the wires 14 and selection of the TFTs 12. As described above, the organic EL display device 1 carries out an image display by selectively causing the organic EL elements 20 to emit, by use of the TFTs 12, light with desired luminance.

The following describes in detail respective configurations of the TFT substrate 10 and each of the organic EL elements 20 both included in the organic EL display device 1.

The description below first deals with the TFT substrate 10.

The TFT substrate 10, as illustrated in FIG. 8, includes on a transparent insulating substrate 11 such as a glass substrate: TFTs 12 (switching elements); an interlayer film 13 (interlayer insulating film planarizing film); wires 14; and an edge cover 15, formed in that order.

The insulating substrate 11 is provided thereon with (i) wires 14 and (ii) TFTs 12 corresponding respectively to the sub-pixels 2R, 2G, and 2B. Since the configuration of a TFT has conventionally been well known, the individual layers of a TFT 12 are not illustrated in the drawings or described herein.

The interlayer film 13 is provided on the insulating substrate 11 throughout the entire region of the insulating substrate 11 to cover the TFTs 12.

There are provided on the interlayer film 13 first electrodes 21 of the organic EL elements 20.

The interlayer film 13 has contact holes 13a for electrically connecting the first electrodes 21 of the organic EL elements 20 to the TFTs 12. This electrically connects the TFTs 12 to the organic EL elements 20 via the contact holes 13a.

The edge cover 15 is an insulating layer for preventing a first electrode 21 and a second electrode 26 of a corresponding organic EL element 20 from short-circuiting with each other due to, for example, (i) a reduced thickness of the organic EL layer in an edge section of the pattern of the first electrode 21 or (ii) an electric field concentration.

The edge cover 15 is so formed on the interlayer film 13 as to cover edge sections of the pattern of the first electrode 21.

The edge cover 15 has openings 15R, 15G, and 15B for the sub-pixels 2R, 2G, and 2B, respectively. The openings 15R, 15G, and 15B of the edge cover 15 define the respective luminescent regions of the sub-pixels 2R, 2G, and 2B.

The sub-pixels 2R, 2G, and 2B are, in other words, isolated from one another by the insulating edge cover 15. The edge cover 15 thus functions as an element isolation film as well.

The description below now deals with each of the organic EL elements 20.

Each of the organic EL elements 20 is a light-emitting element capable of high-luminance light emission based on low-voltage direct-current driving, and includes: a first electrode 21; an organic EL layer; and a second electrode 26, provided on top of one another in that order.

The first electrode 21 is a layer having the function of injecting (supplying) positive holes into the organic EL layer. The first electrode 21 is, as described above, connected to a corresponding TFT 12 via a corresponding contact hole 13a.

The organic EL layer provided between the first electrode 21 and the second electrode 26 includes, as illustrated in FIG. 8: a hole injection layer/hole transfer layer 22; luminescent layers 23R, 23G, and 23B; an electron transfer layer 24; and an electron injection layer 25, formed in that order from the first electrode 21 side.

The above stack order intends to use (i) the first electrode 21 as an anode and (ii) the second electrode 26 as a cathode. The stack order of the organic EL layer is reversed in the case where the first electrode 21 serves as a cathode and the second electrode 26 serves as an anode.

The hole injection layer has the function of increasing efficiency in injecting positive holes into the luminescent layers 23R, 23G, and 23B. The hole transfer layer has the function of increasing efficiency in transferring positive holes to the luminescent layers 23R, 23G, and 23B. The hole injection layer/hole transfer layer 22 is so formed uniformly throughout the entire display region of the TFT substrate 10 as to cover the first electrodes 21 and the edge cover 15.

The present embodiment describes an example case involving, as the hole injection layer and the hole transfer layer, a hole injection layer/hole transfer layer 22 that integrally combines a hole injection layer with a hole transfer layer as described above. The present embodiment is, however, not limited to such an arrangement: The hole injection layer and the hole transfer layer may be provided as separate layers independent of each other.

There are provided on the hole injection layer/hole transfer layer 22 the luminescent layers 23R, 23G, and 23B so formed in correspondence with the respective sub-pixels 2R, 2G, and 2B as to cover the respective openings 15R, 15G, and 15B of the edge cover 15.

The luminescent layers 23R, 23G, and 23B are each a layer that has the function of emitting light by recombining (i) holes (positive holes) injected from the first electrode 21 side with (ii) electrons injected from the second electrode 26 side. The luminescent layers 23R, 23G, and 23B are each made of a material with high luminous efficiency, such as a low-molecular fluorescent dye and a metal complex.

The electron transfer layer 24 is a layer that has the function of increasing efficiency in transferring electrons from the second electrode 26 to the luminescent layers 23R, 23G, and 23B. The electron injection layer 25 is a layer that has the function of increasing efficiency in injecting electrons from the second electrode 26 into the luminescent layers 23R, 23G, and 23B.

The electron transfer layer 24 is so provided on the luminescent layers 23R, 23G, and 23B and the hole injection layer/hole transfer layer 22 uniformly throughout the entire display region of the TFT substrate 10 as to cover the luminescent layers 23R, 23G, and 23B and the hole injection layer/hole transfer layer 22. The electron injection layer 25 is so provided on the electron transfer layer 24 uniformly throughout the entire display region of the TFT substrate 10 as to cover the electron transfer layer 24.

The electron transfer layer 24 and the electron injection layer 25 may be provided either (i) as separate layers independent of each other as described above or (ii) integrally with each other. In other words, the organic EL display device 1 may include an electron transfer layer/electron injection layer instead of the electron transfer layer 24 and the electron injection layer 25.

The second electrode 26 is a layer having the function of injecting electrons into the organic EL layer including the above organic layers. The second electrode 26 is so provided on the electron injection layer 25 uniformly throughout the entire display region of the TFT substrate 10 as to cover the electron injection layer 25.

The organic layers other than the luminescent layers 23R, 23G, and 23B are not essential for the organic EL layer, and may thus be included as appropriate in accordance with a required property of the organic EL element 20. The organic EL layer may further include a carrier blocking layer according to need. The organic EL layer can, for example, additionally include, as a carrier blocking layer, a hole blocking layer between the luminescent layers 23R, 23G, and 23B and the electron transfer layer 24 to prevent positive holes from transferring from the luminescent layers 23R, 23G, and 23B to the electron transfer layer 24 and thus to improve luminous efficiency.

The organic EL elements 20 can have, for example, any of the layered structures (1) through (8) below.

(1) first electrode/luminescent layer/second electrode
(2) first electrode/hole transfer layer/luminescent layer/electron transfer layer/second electrode
(3) first electrode/hole transfer layer/luminescent layer/hole blocking layer (carrier blocking layer)/electron transfer layer/second electrode
(4) first electrode/hole transfer layer/luminescent layer/hole blocking layer/electron transfer layer/electron injection layer/second electrode
(5) first electrode/hole injection layer/hole transfer layer/luminescent layer/electron transfer layer/electron injection layer/second electrode
(6) first electrode/hole injection layer/hole transfer layer/luminescent layer/hole blocking layer/electron transfer layer/second electrode
(7) first electrode/hole injection layer/hole transfer layer/luminescent layer/hole blocking layer/electron transfer layer/electron injection layer/second electrode
(8) first electrode/hole injection layer/hole transfer layer/electron blocking layer (carrier blocking layer)/luminescent layer/hole blocking layer/electron transfer layer/electron injection layer/second electrode As described above, the hole injection layer and the hole transfer layer, for example, may be integrated with each other. The electron transfer layer and the electron injection layer may be integrated with each other.

The structure of the organic EL element 20 is not limited to the above example layered structure, and may be a desired layered structure according to a required property of the organic EL element 20 as described above.

The description below deals with a method for producing the organic EL display device 1.

Figure 9:
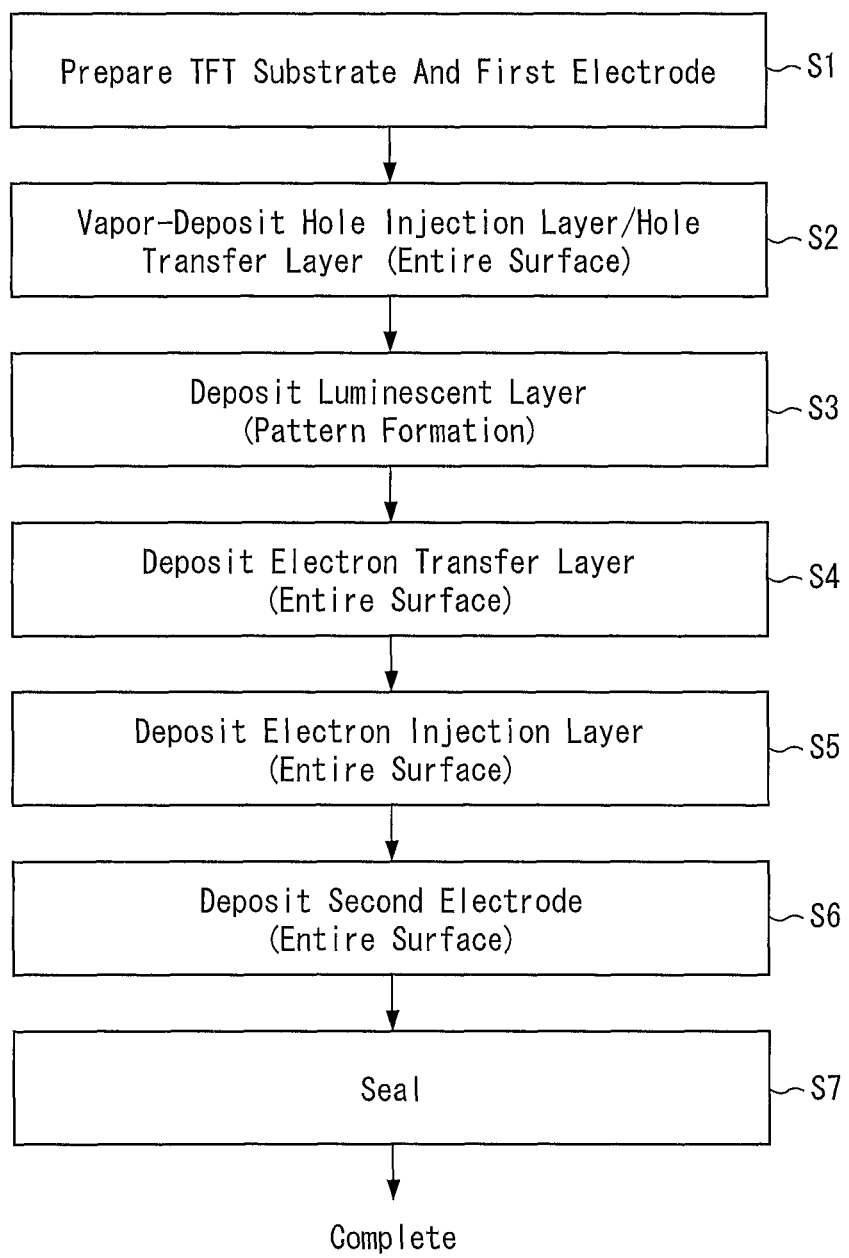
FIG. 9 is a flowchart indicating successive steps for producing an organic EL display device in accordance with an embodiment of the present invention.

FIG. 9 is a flowchart indicating successive steps for producing the organic EL display device 1.

As illustrated in FIG. 9, the method of the present embodiment for producing the organic EL display device 1 includes steps such as a TFT substrate and first electrode preparing step (S1), a hole injection layer/hole transfer layer vapor deposition step (S2), a luminescent layer vapor deposition step (S3), an electron transfer layer vapor deposition step (S4), an electron injection layer vapor deposition step (S5), a second electrode vapor deposition step (S6), and a sealing step (S7).

The following describes, with reference to the flowchart illustrated in FIG. 9, the individual steps described above with reference to FIGS. 6 and 8.

Note however, that the dimensions, materials, shapes and the like of the respective constituent elements described in the present embodiment merely serve as an embodiment, and that the scope of the present invention should not be construed limitedly on the grounds of such aspects of the constituent elements.

The stack order described in the present embodiment, as mentioned above, intends to use (i) the first electrode 21 as an anode and (ii) the second electrode 26 as a cathode. In the converse case where the first electrode 21 serves as a cathode and the second electrode 26 serves as an anode, the stack order of the organic EL layer is reversed, and the respective materials of the first electrode 21 and the second electrode 26 are switched similarly.

First, as illustrated in FIG. 8, the method of the present embodiment (i) applies a photosensitive resin onto an insulating substrate 11 that is made of a material such as glass and that includes, for example, TFTs 12 and wires 14 each formed by a publicly known technique, and (ii) carries out patterning with respect to the photosensitive resin by photolithography. This forms an interlayer film 13 on the insulating substrate 11.

The insulating substrate 11 is, for example, a glass or plastic substrate having (i) a thickness of 0.7 to 1.1 mm, (ii) a length (longitudinal length) of 400 to 500 mm along a y axis direction, and (iii) a length (lateral length) of 300 to 400 mm along an x axis direction. The insulating substrate 11 of the present embodiment was a glass substrate.

The interlayer film 13 can be made of, for example, an acrylic resin or a polyimide resin. The acrylic resin is, for example, a product in the Optomer series available from JSR Corporation. The polyimide resin is, for example, a product in the Photoneece series available from Toray Industries, Inc. Note that since a typical polyimide resin is not transparent but colored, the interlayer film 13 is more suitably made of a transparency resin such as an acrylic resin in the case where an organic EL display device of the bottom emission type is produced as the organic EL display device 1 as illustrated in FIG. 8.

The interlayer film 13 is simply required to have a film thickness that can compensate for the difference in level created by the TFTs 12. The film thickness is thus not particularly limited. The film thickness was, for example, approximately 2 μm in the present embodiment.

The method of the present embodiment next forms, in the interlayer film 13, contact holes 13a for electrically connecting the first electrodes 21 to the TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist exfoliative solution, and further washes the substrate. This forms, on the interlayer film 13, first electrodes 21 in a matrix.

The conductive film material for the first electrode 21 is, for example, (i) a transparent conductive material such as ITO, IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method.

The thickness of the first electrodes 21 is not particularly limited. The first electrodes 21 can have a thickness of, for example, 100 nm as mentioned above.

The method next forms a pattern of an edge cover 15, as with the interlayer film 13, to have a film thickness of, for example, approximately 1 μm. The edge cover 15 can be made of an insulating material similar to that for the interlayer film 13.

The step described above prepares the TFT substrate 10 and the first electrode 21 (S1).

The method of the present embodiment next carries out, with respect to the TFT substrate 10 prepared through the above step, (i) a bake under a reduced pressure for dehydration and (ii) an oxygen plasma treatment for surface washing of the first electrode 21.

The method then carries out vapor deposition of a hole injection layer and a hole transfer layer (in the present embodiment, a hole injection layer/hole transfer layer 22) on the TFT substrate 10 throughout its entire display region with use of a conventional vapor deposition device (S2).

Specifically, the method (i) carries out an alignment adjustment, relative to the TFT substrate 10, of an open mask having an opening corresponding to the entire display region and (ii) closely attaches the open mask to the TFT substrate 10. The method then, while rotating the TFT substrate 10 and the open mask together, carries out, through the opening of the open mask and uniformly throughout the entire display region, vapor deposition of vapor deposition particles scattered from a vapor deposition source.

The above vapor deposition carried out throughout the entire display region refers to vapor deposition carried out unintermittently over sub-pixels having different colors and located adjacent to one another.

The hole injection layer and the hole transfer layer are each made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of an open chain conjugated system or a heterocyclic conjugated system, such as a thiophene compound and an aniline compound.

The hole injection layer and the hole transfer layer may be either integrated with each other as described above or formed as separate layers independent of each other. The hole injection layer and the hole transfer layer each have a film thickness of, for example, 10 to 100 nm.

The present embodiment used, as the hole injection layer and the hole transfer layer, a hole injection layer/hole transfer layer 22 that was made of 4,4'-bis[N-(1-naphthyl)-N-phenylamino]biphenyl(α-NPD) and that had a film thickness of 30 nm.

The method of the present embodiment next carries out a selective application formation (pattern formation) of luminescent layers 23R, 23G, and 23B on the hole injection layer/hole transfer layer 22 in correspondence with respective sub-pixels 2R, 2G, and 2B so that the luminescent layers 23R, 23G, and 23B cover respective openings 15R, 15G, and 15B of the edge cover 15 (S3).

As described above, the luminescent layers 23R, 23G, and 23B are each made of a material with high luminous efficiency, such as a low-molecular fluorescent dye and a metal complex.

The luminescent layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate) aluminum complex, (iii) a bis(benzohydroxyquinolinate) beryllium complex, (iv) a tri (dibenzoylmethyl) phenanthroline europium complex, (v) and ditoluyl vinyl biphenyl.

The luminescent layers 23R, 23G, and 23B each have a film thickness of, for example, 10 to 100 nm.

The vapor deposition method and the vapor deposition device of the present embodiment are each particularly suitably used for a selective application formation (pattern formation) of such luminescent layers 23R, 23G, and 23B.

A description below deals in detail with a selective application formation of the luminescent layers 23R, 23G, and 23B which selective application formation involves the vapor deposition method and the vapor deposition device of the present embodiment.

The method of the present embodiment next carries out, in a manner similar to that described for the above hole injection layer/hole transfer layer vapor deposition step (S2), vapor deposition of an electron transfer layer 24 throughout the entire display region of the TFT substrate 10 so that the electron transfer layer 24 covers the hole injection layer/hole transfer layer 22 and the luminescent layers 23R, 23G, and 23B (S4).

The method then carries out, in a manner similar to that described for the above hole injection layer/hole transfer layer vapor deposition step (S2), vapor deposition of an electron injection layer 25 throughout the entire display region of the TFT substrate 10 so that the electron injection layer 25 covers the electron transfer layer 24 (S5).

The electron transfer layer 24 and the electron injection layer 25 are each made of a material such as a tris(8-hydroxyquinolinate) aluminum complex, an oxadiazole derivative, a triazole derivative, a phenylquinoxaline derivative, or a silole derivative.

As mentioned above, the electron transfer layer 24 and the electron injection layer 25 may be either integrated with each other or formed as separate layers independent of each other. The electron transfer layer 24 and the electron injection layer 25 each have a film thickness of, for example, 1 to 100 nm. The respective film thicknesses of the electron transfer layer 24 and the electron injection layer 25 add up to, for example, 20 to 200 nm.

In the present embodiment, (i) the electron transfer layer 24 was made of Alq, whereas the electron injection layer 25 was made of LiF, and (ii) the electron transfer layer 24 had a film thickness of 30 nm, whereas the electron injection layer 25 had a film thickness of 1 nm.

The method of the present embodiment next carries out, in a manner similar to that described for the above hole injection layer/hole transfer layer vapor deposition step (S2), vapor deposition of a second electrode 26 throughout the entire display region of the TFT substrate 10 so that the second electrode 26 covers the electron injection layer 25 (S6).

The second electrode 26 is suitably made of a material (electrode material) such as a metal with a small work function. Examples of such an electrode material include a magnesium alloy (for example, MgAg), an aluminum alloy (for example, AlLi, AlCa, or AlMg) and calcium metal. The second electrode 26 has a thickness of, for example, 50 to 100 nm.

In the present embodiment, the second electrode 26 was made of aluminum and has a film thickness of 50 nm. The operation described above forms, on the TFT substrate 10, organic EL elements 20 each including the organic EL layer, the first electrode 21, and the second electrode 26 described above.

The method of the present embodiment then attached (i) the TFT substrate 10, on which the organic EL elements 20 is provided, to (ii) a sealing substrate 40 with use of an adhesive layer 30 as illustrated in FIG. 6 so that the organic EL elements 20 were contained.

The sealing substrate 40 is, for example, an insulating substrate such as a glass substrate and a plastic substrate and 0.4 to 1.1 mm in thickness. The sealing substrate 40 of the present embodiment was a glass substrate.

The longitudinal and lateral lengths of the sealing substrate 40 may each be adjusted as appropriate in accordance with the size of a target organic EL display device 1. The sealing substrate 40 may be an insulating substrate substantially equal in size to the insulating substrate 11 of the TFT substrate 10, in which case a combination of the sealing substrate 40, the TFT substrate 10, and the organic EL elements 20 contained therebetween is divided in accordance with the size of a target organic EL display device 1.

The method for containing the organic EL elements 20 is not limited to the method described above. Examples of other containing methods include (i) a method that uses a centrally depressed glass substrate as the sealing substrate 40 and that the combination of the sealing substrate 40 and the TFT substrate 10 is sealed along the edge in a frame shape with use of, for example, a sealing resin or fritted glass, and (ii) a method that fills a space between the TFT substrate 10 and the sealing substrate 40 with a resin. The method for producing the organic EL display device 1 does not depend on the above containing method, and can employ any of various containing methods.

The second electrode 26 may be provided thereon with a protective film (not shown) that covers the second electrode 26 and that prevents infiltration of oxygen, moisture and the like present outside into the organic EL elements 20.

The protective film is made of an electrically insulating or conductive material such as silicon nitride and silicon oxide. The protective film has a thickness of, for example, 100 to 1000 nm.

Through the above steps, the organic EL display device 1 is finally produced.

The organic EL display device 1 turns on a TFT 12 upon receipt of a signal through a wire 14, and thus allows (i) positive holes to be injected from the first electrode 21 into the organic EL layer and also (ii) electrons to be injected from the second electrode 26 into the organic EL layer. This causes the positive holes and the electrons to recombine with each other inside the luminescent layers 23R, 23G, and 23B. The positive holes and the electrons thus recombined are emitted in the form of light when becoming inactive.

In the above organic EL display device 1, controlling respective light emission luminances of the sub pixels 2R, 2G, and 2B allows a predetermined image to be displayed.

The following describes an arrangement of a vapor deposition device of the present embodiment.

Figure 1:
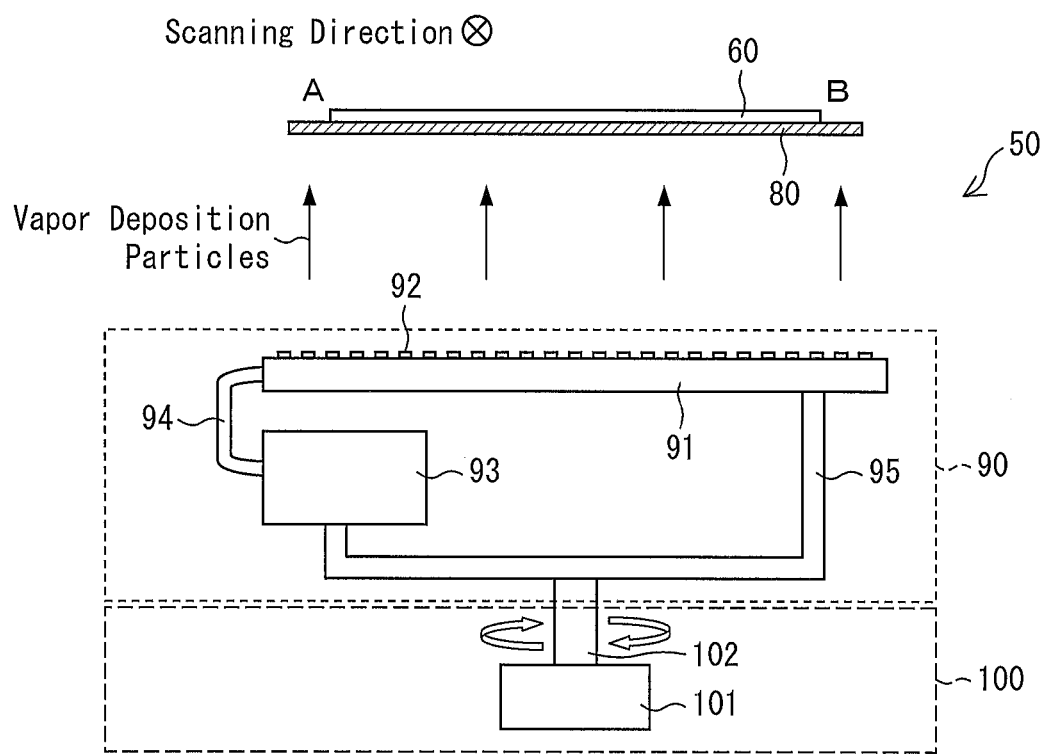
FIG. 1 is a side view illustrating a configuration of a vapor deposition device in accordance with an embodiment of the present invention.
Figure 2:
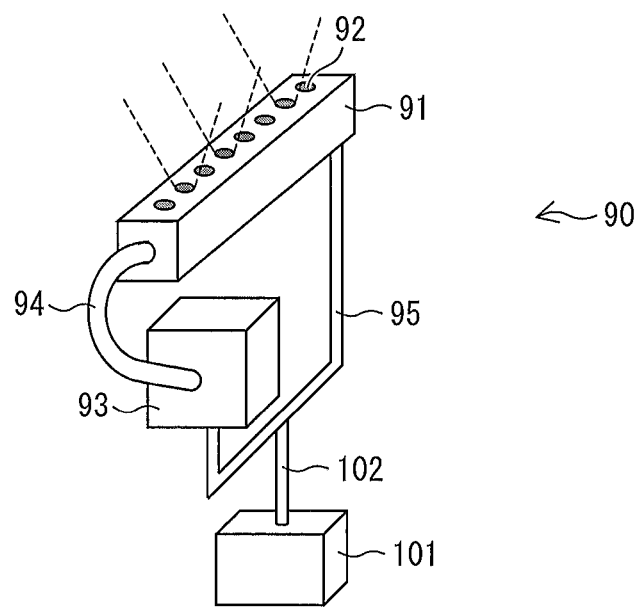
FIG. 2 is a perspective view schematically illustrating a configuration of a vapor deposition source unit provided in the vapor deposition device.

FIG. 1 is a side view illustrating a configuration of a vapor deposition device 50 in accordance with the present embodiment. FIG. 2 is a perspective view schematically illustrating a configuration of a vapor deposition source unit 90 provided to the vapor deposition device 50.

As shown in FIG. 1, the vapor deposition device 50 is configured to form a film on a film formation substrate 60 and to be placed in a vacuum chamber. The vapor deposition device 50 includes a shadow mask 80, the vapor deposition source unit 90, and a rotating mechanism 100. Note that structures of the film formation substrate 60 and the shadow mask 80 are identical to those of the film formation substrate 260 and the shadow mask 280 shown in FIG. 13, respectively.

The vapor deposition source unit 90 includes a vapor deposition source 91 and a vapor deposition source crucible 93 (vapor deposition particle supplying means). Configurations of the vapor deposition source 91 and the vapor deposition source crucible 93 are identical to those of the vapor deposition source 291 and the vapor deposition source crucible 293 of the conventional vapor deposition device 250 as shown in FIG. 13, respectively.

That is, the vapor deposition source 91 has a plurality of injection holes 92 from which vapor deposition particles are to be injected. As shown in FIG. 2, the injection holes 92 are arranged in a line. Further, the vapor deposition source crucible 93 contains a vapor deposition material which is in solid or liquid form. The vapor deposition material is heated inside the vapor deposition source crucible 93 so as to be gaseous vapor deposition particles, and then supplied (introduced) via the pipe 94 to the vapor deposition source 91. The pipe 94 is connected to the vapor deposition source 91 at an end (supply-side end) where one end of the line of the injection holes 92 is located. The vapor deposition particles thus supplied to the vapor deposition source 91 are injected from the injection holes 92.

The film formation substrate 60 and the vapor deposition source 91 are arranged so that a vapor-deposited surface of the film formation substrate 60 and the vapor deposition source face each other. The shadow mask 80, which has an opening corresponding to a pattern of a vapor deposition region, is fixed tightly to the vapor-deposited surface of the film formation substrate 60 so that the vapor deposition particles are prevented from adhering to a region other than the intended vapor deposition region. While the vapor deposition particles are injected from the injection holes 92, the film formation substrate 60 and the shadow mask 80 are moved (scanned) relative to the vapor deposition source 91 by moving means (not shown). Specifically, while the vapor deposition source 91 is injecting the vapor deposition particles towards the film formation substrate 60, the moving means moves the film formation substrate 60 and the shadow mask 80 back and forth along a direction perpendicular to a direction in which the injection holes 92 are arranged (i.e., in a direction going away from a viewer of FIG. 1 and in a direction coming back toward the viewer of FIG. 1). This forms a predetermined pattern on the film formation substrate 60.

Figure 13:
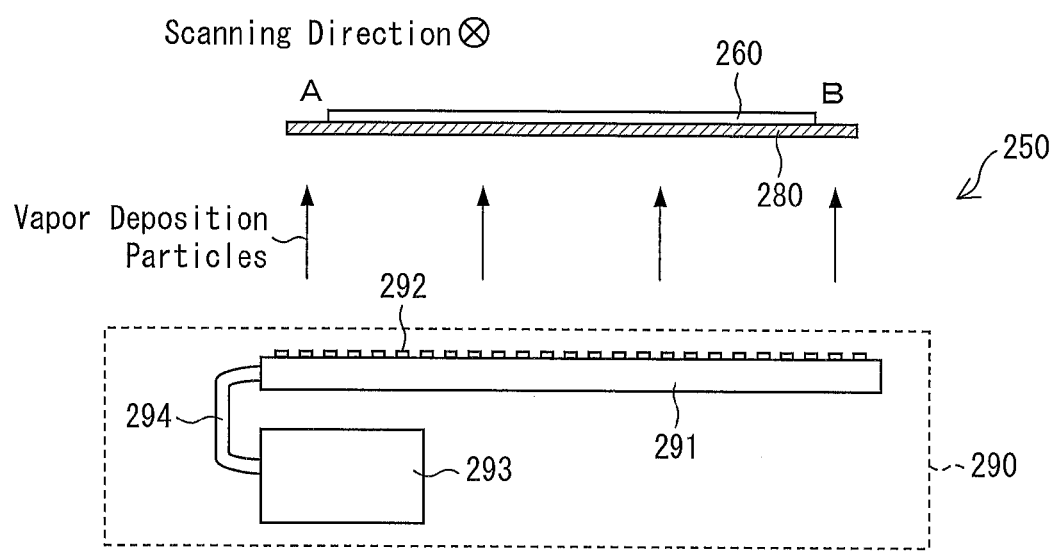
FIG. 13 is a side view schematically illustrating a configuration of a conventional vapor deposition device.
Figure 14:
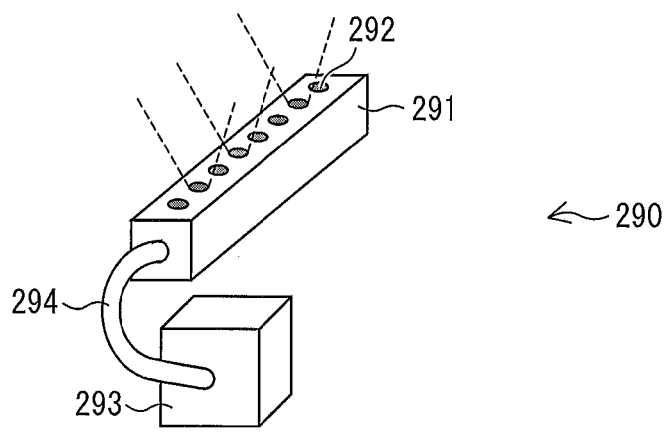
FIG. 14 is a perspective view schematically illustrating a configuration of a vapor deposition source unit of the vapor deposition device shown in FIG. 13.
Figure 15:
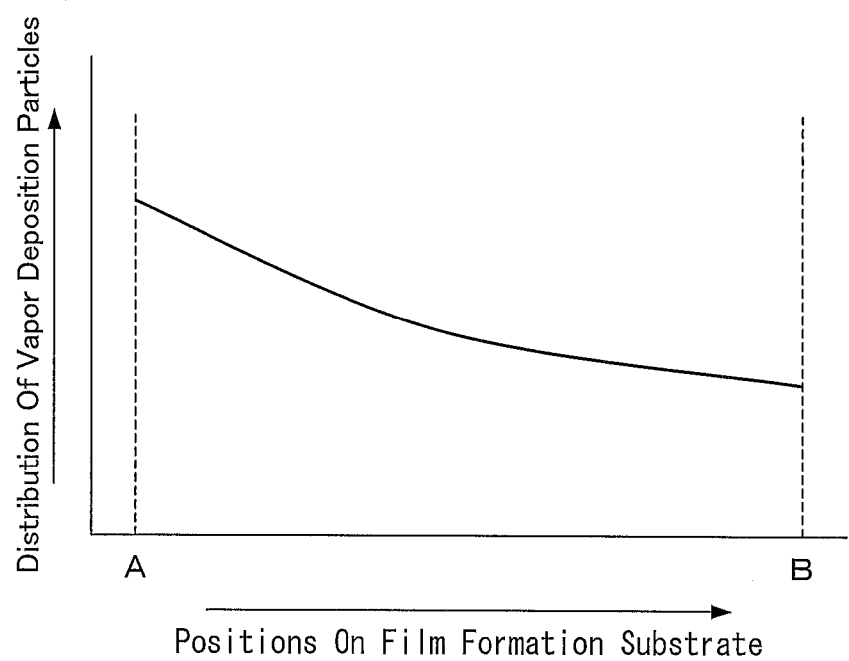
FIG. 15 is a graph illustrating a relationship between (i) positions on a film formation substrate along a direction in which injection holes in a vapor deposition source are arranged and (ii) distribution (thickness) of vapor deposition particles.

According to the conventional vapor deposition device 250 shown in FIG. 13, the positions of the vapor deposition source 291 and the vapor deposition source crucible 293 are fixed. On the other hand, according to the vapor deposition device 50 of the present embodiment, there is provided the rotating mechanism 100 (rotating means) which rotates the vapor deposition source 91 and the vapor deposition source crucible 93.

The rotating mechanism 100 includes a rotation motor 101 and a rotation shaft 102. As shown in FIGS. 1 and 2, the vapor deposition source 91 and the vapor deposition source crucible 93 are connected to one end and the other end of a U-shaped support stick 95, respectively. Further, a center portion of the support stick 95 is connected to the rotation shaft 102 which is to be rotated by the rotation motor 101. According to this arrangement, when the rotation motor 101 rotates the rotation shaft 102, the vapor deposition source 91 and the vapor deposition source crucible 93 rotate so that their rotation axes are perpendicular to the film formation substrate 60. Note that the direction of the rotation shaft can deviate from the direction perpendicular to the film formation substrate 60, provided that uniformity of film thickness distribution is achieved.

Note that the rotation motor 101 can be provided outside the vacuum chamber and configured to rotate the vapor deposition source unit 90 inside the vacuum chamber via the rotation shaft 102.

According to the configuration, the direction in which the injection holes 92 are arranged is reversed according to the direction in which the film formation substrate 60 is scanned. Specifically, (i) first, while the vapor deposition source 91 is in such a position that its part connected to the pipe 94 is located on the left side of FIG. 1, vapor deposition particles are supplied via the pipe 94 to the vapor deposition source 91 (vapor deposition supplying step), and (ii) while the film formation substrate 60 is being scanned away from the viewer of FIG. 1 (such a direction is referred to as a forth direction), vapor deposition particles are injected from the injection holes 92 towards the film formation substrate 60 (first injecting step).

After the scanning in the forth direction (i.e. when the film formation substrate 60 reached a position where it does not face the vapor deposition source 91), the rotation mechanism 100 rotates the vapor deposition source 91 by 180 degrees so as to reverse the direction in which the injection holes 92 are arranged (rotating step). This causes the part connected to the pipe 94 to be located on the right side of the drawing (see FIG. 3). In this state, vapor deposition particles are injected from the injection holes 92 towards the film formation substrate 60 while the film formation substrate 60 is being scanned back toward the viewer of FIG. 3 (such a direction is referred to as a back direction) (second injecting step). After the scanning in the back direction, injection of vapor deposition particles is stopped.

Figure 4:
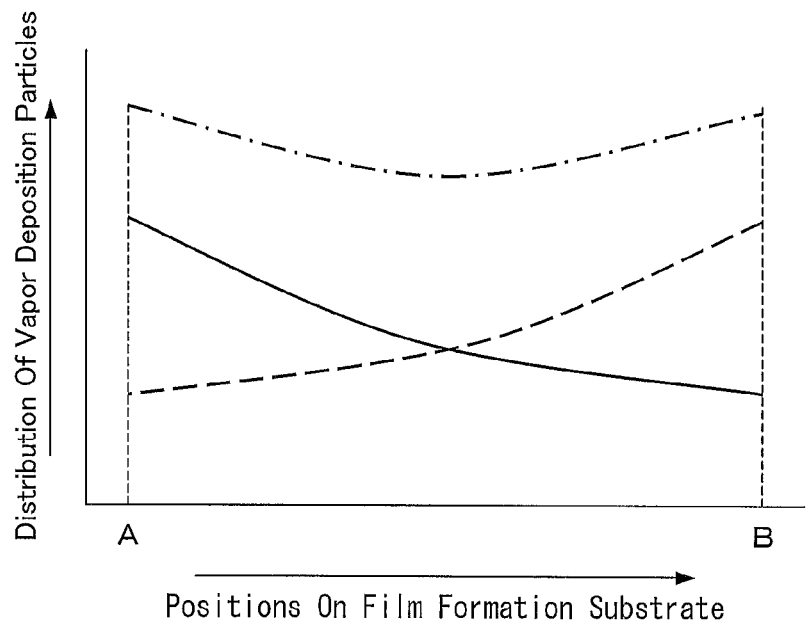
FIG. 4 is a graph illustrating a relationship between (i) positions on a film formation substrate along a direction in which injection holes in a vapor deposition source are arranged and (ii) distribution (thickness) of vapor deposition particles.

FIG. 4 is a graph illustrating a relationship between (i) positions on the film formation substrate 60 along a direction in which the injection holes 92 are arranged and (ii) distribution (thickness) of vapor deposition particles. It is assumed in this graph that (i) a position which faces a supply-side end of the vapor deposition source 91 in FIG. 1 is a position A and (ii) a position which faces the other end opposite to the supply-side end of the vapor deposition source 91 is a position B. A solid line in the graph shows distribution of vapor deposition particles deposited in a case where the film formation substrate 60 is scanned in the forth direction, whereas a dashed line shows distribution of vapor deposition particles deposited in a case where the film formation substrate 60 is scanned in the back direction. Further, a dot-dash line shows distribution of vapor deposition particles after the completion of the scanning in the back and forth directions.

The amount of vapor deposition particles to be injected from the injection holes decreases with increasing distance from the supply-side end of the vapor deposition source 91. Therefore, the distribution of the vapor deposition particles which are deposited when the film formation substrate 60 is scanned in the forth direction (see FIG. 1) gradually decreases from the position A to the position B, as shown by the solid line.

Figure 3:
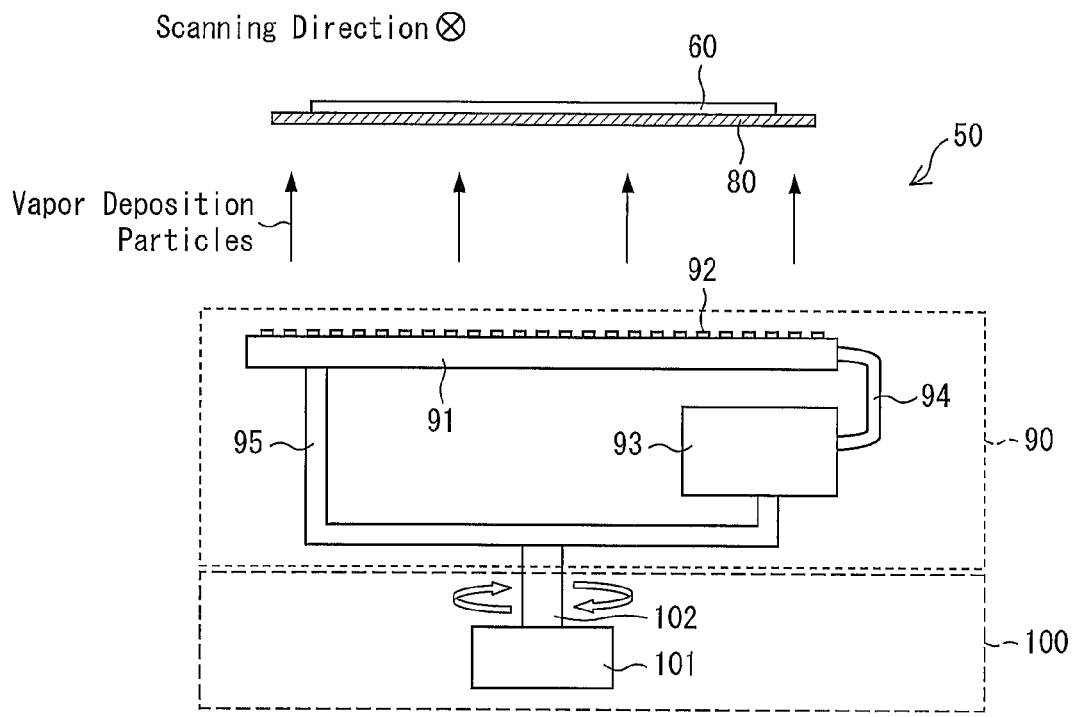
FIG. 3 is a side view illustrating the vapor deposition device shown in FIG. 1, in which the vapor deposition source unit is rotated by 180 degrees.

On the other hand, in the case where the film formation substrate 60 is scanned in the back direction, the vapor deposition source 91 is rotated by 180 degrees as shown in FIG. 3. Accordingly, the distribution of the amount of vapor deposition particles to be injected towards the film formation substrate 60 is also reversed. Therefore, as shown by the dashed line, film thickness distribution obtained when the film formation substrate 60 is scanned in the back direction and the film thickness distribution shown by the solid line are symmetrical about an intermediate position between the position A and the position B.

The film thickness distribution after the completion of the scanning of the film formation substrate 60 in the back and forth directions is a sum of the film thickness distribution shown by the solid line and the film thickness distribution shown by the dashed line. Therefore, as shown by the dot-dash line, the film thickness distribution after the completion of the scanning of the film formation substrate 60 in the back and forth directions is uniform in comparison with the film thickness distribution obtained when the scanning is carried out in the forth direction and that obtained when the scanning is carried out in the back direction. That is, by arranging the vapor deposition source 91 such that its direction is 180 degrees different between when the scanning is carried out in the back direction and when the scanning is carried out in the forth direction, it is possible to reduce the influences of pressure difference inside supply paths and the injection holes and thus possible to obtain film thickness distribution which is uniform across the entire deposition region. Specifically, by applying the vapor deposition device 50 to vapor deposition of luminescent layers of organic EL elements, it is possible to produce an organic EL display device which causes less display unevenness.

Further, in a case where the distribution of vapor deposition particles shown by the solid line and that shown by the dashed line in FIG. 4 monotonically increases and decreases (or decreases and increases) respectively in a linear fashion with respect to the positions on the film formation substrate, a combination of such distributions of vapor deposition particles provides completely uniform film thickness distribution. That is, the present embodiment provides the highest effect in such a case.

Note that it is not necessary to carry out the rotation of the vapor deposition source 91 every time the scanning direction of the film formation substrate 60 is changed. For example, the rotation of the vapor deposition source 91 can be carried out such that (i) the film formation substrate 60 is scanned in the back and forth directions three times in the state as shown in FIG. 1, (ii) the vapor deposition source 91 is rotated, and then (iii) the film formation substrate 60 is scanned in the back and forth directions three times in the state as shown in FIG. 3.

The rotation of the vapor deposition source 91 is carried out, after the film formation substrate 60 has passed over the vapor deposition source 91, while the film formation substrate 60 is in such a position that vapor deposition particles do not reach the vapor deposition source 91. During the rotation of the vapor deposition source 91, it is preferable to stop the injection of vapor deposition particles with use of a valve and/or a shutter, because the vapor deposition particles may otherwise be injected towards an unintended space. Alternatively, a deposition preventing plate can be used to prevent the vapor deposition particles from being scattered.

Figure 5:
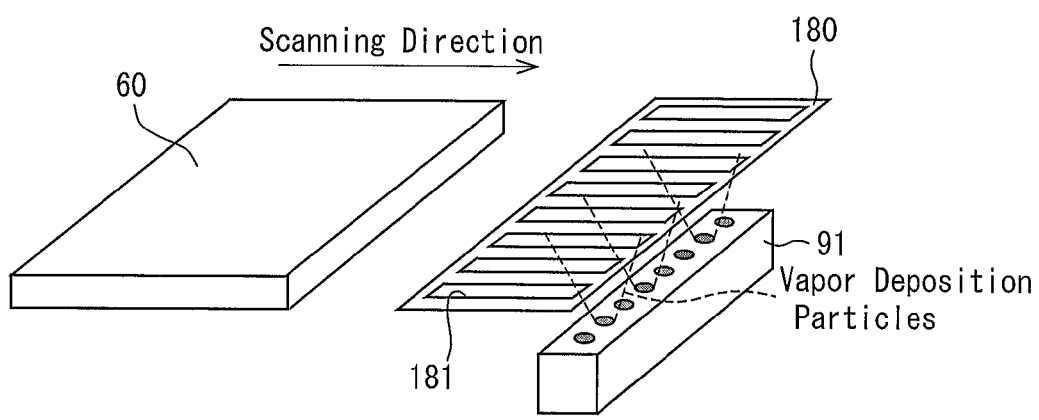
FIG. 5 is a view illustrating a modification example of the vapor deposition device.

In the present embodiment, the film formation substrate and the shadow mask are in close contact with each other; however, vapor deposition can be carried out in a state where there is a gap between the film formation substrate and the shadow mask. Moreover, although the shadow mask of the present embodiment covers the entire surface of the film formation substrate, this does not imply any limitation. For example, as shown in FIG. 5, a shadow mask 180 can be used which has a smaller area than the vapor deposition region of the film formation substrate 60.

In this case, vapor deposition is carried out in the following manner. The relative positions of the shadow mask 180 and the vapor deposition source 91 are fixed, and the shadow mask 180 and the vapor deposition source 91 are positioned so that the shadow mask 180 faces the film formation substrate with a certain gap between the shadow mask 180 and the film formation substrate. Then, the film formation substrate 60 is moved relative to the shadow mask 180 and the vapor deposition source 91, whereby vapor deposition particles are consecutively deposited through openings 181 in the shadow mask 180 onto a vapor deposition region of the film formation substrate 60.

Embodiment 2

Figure 10:
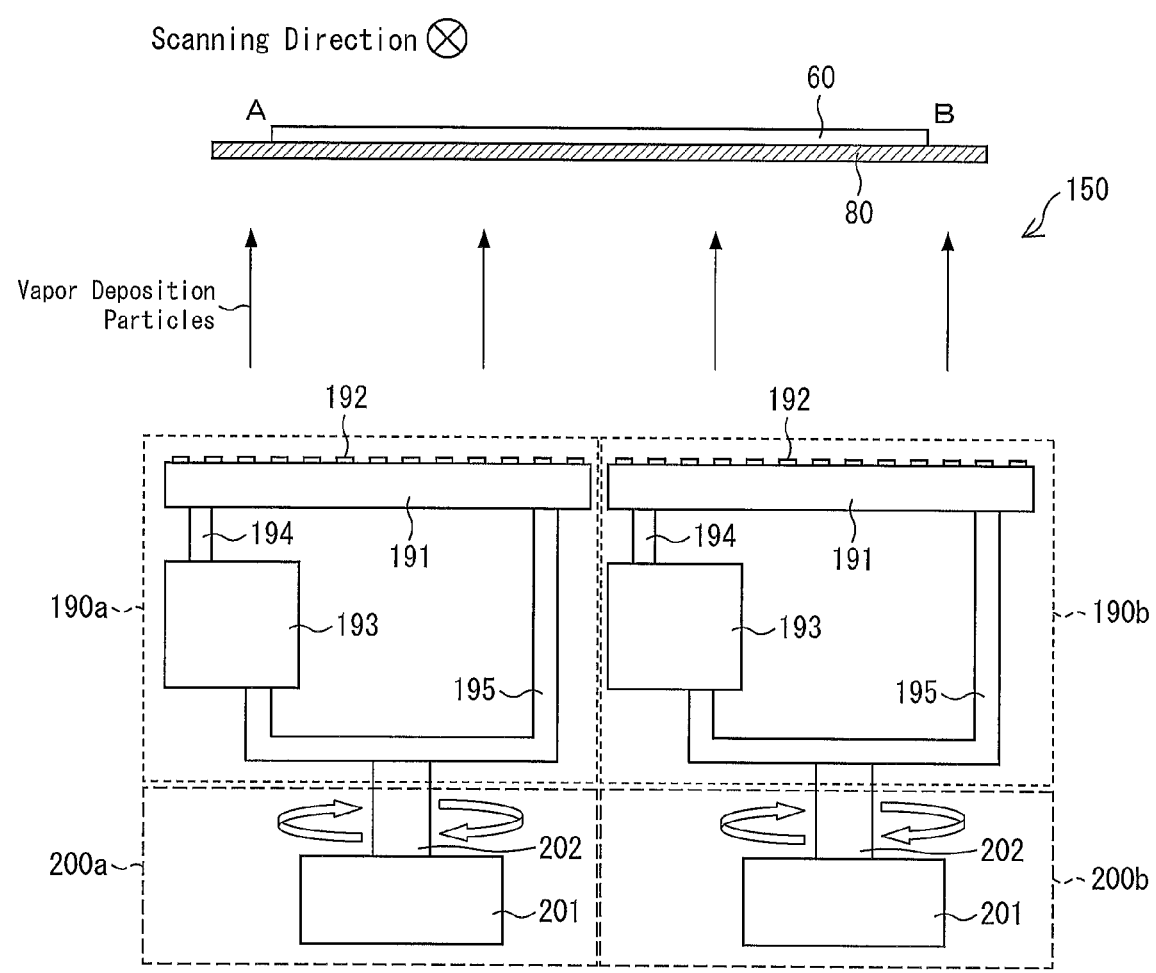
FIG. 10 is a side view illustrating a configuration of a vapor deposition device in accordance with another embodiment of the present invention.
Figure 11:
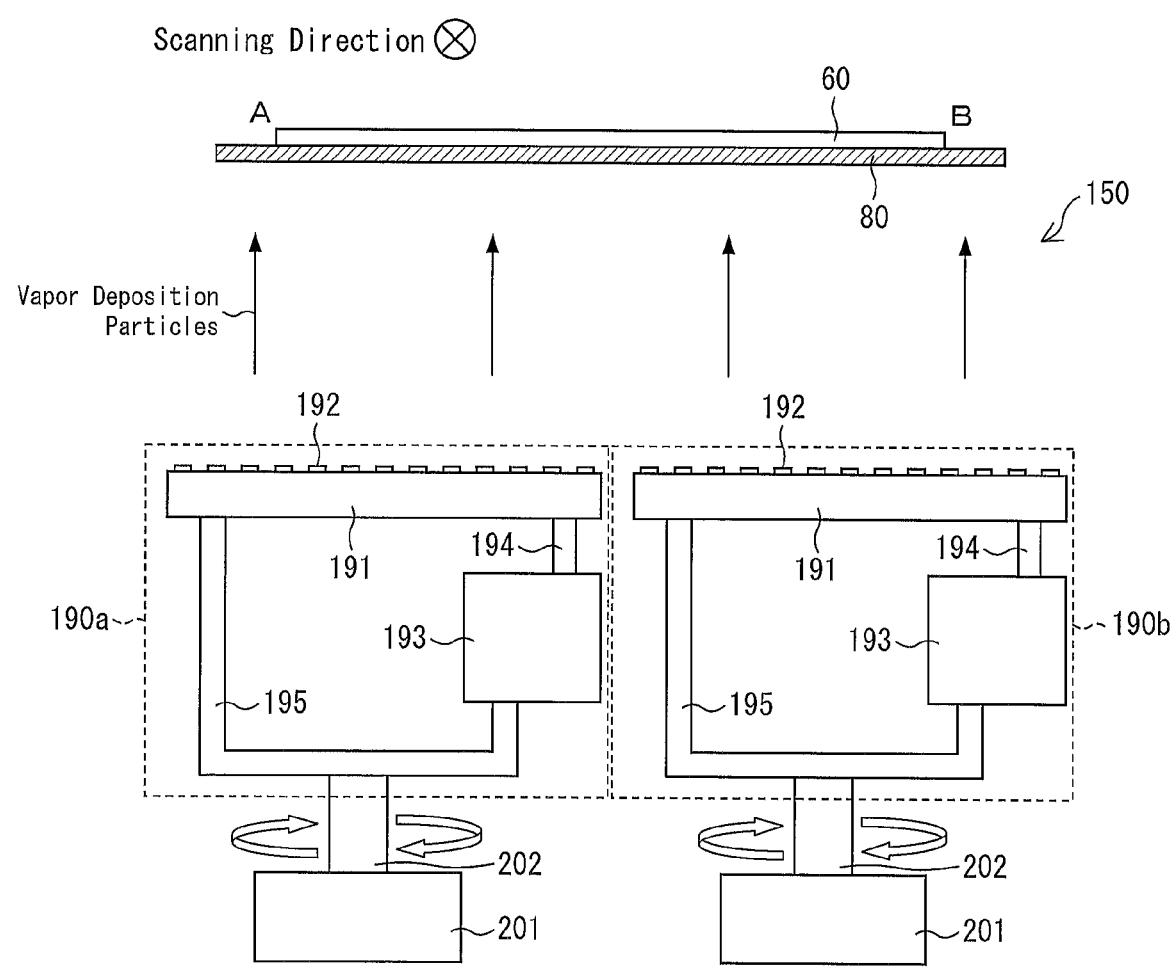
FIG. 11 is a side view illustrating the vapor deposition device shown in FIG. 10, in which the vapor deposition source unit is rotated by 180 degrees.
Figure 12:
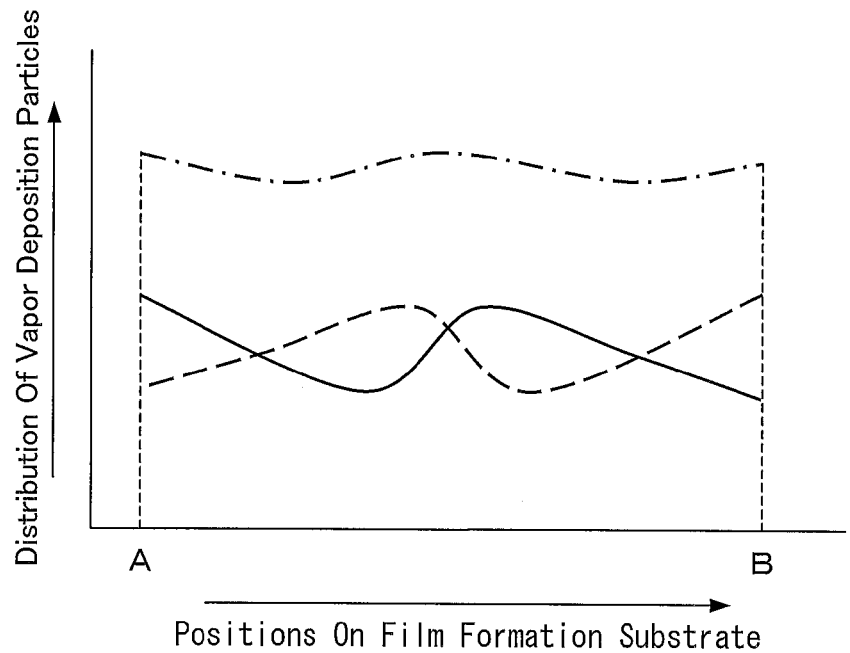
FIG. 12 is a graph illustrating a relationship between (i) positions on a film formation substrate along a direction in which injection holes in a vapor deposition source are arranged and (ii) distribution (thickness) of vapor deposition particles.

The following description will discuss another embodiment of the present invention with reference to FIGS. 10 through 12. The present embodiment deals with a vapor deposition device which includes a plurality of vapor deposition source units. Note that, for convenience of description, members having functions identical to those of the respective members described in Embodiment 1 are given respective identical reference numerals, and descriptions of those members are omitted here.

FIG. 10 is a side view illustrating a configuration of a vapor deposition device 150 in accordance with the present embodiment. The vapor deposition device 150 is configured to form a film on a film formation substrate 60 in a vacuum chamber. The vapor deposition device 150 includes a shadow mask 80, two vapor deposition source units 190a and 190b, and two rotation mechanisms (rotating means) 200a and 200b.

The vapor deposition source unit 190a and the vapor deposition source unit 190b have the same configuration, and each include a vapor deposition source 191 and a vapor deposition source crucible (vapor deposition particle supplying means) 193.

The vapor deposition source 191 has a plurality of injection holes 192 through which vapor deposition particles are to be injected. The injection holes 192 are arranged in a line. The number of the injection holes in the vapor deposition source 191 is half the number of those of the vapor deposition source 91 shown in FIG. 1, and the length of the line of the injection holes in the vapor deposition source 191 is half the length of that of the vapor deposition source 91.

The vapor deposition source crucible 193 has substantially the same configuration as that of the vapor deposition source crucible 93 shown in FIG. 1, except that the vapor deposition source crucible 193 has (i) a capacity for a vapor deposition material which is half as much as that of the vapor deposition source crucible 93 and (ii) supplies the vapor deposition material half as fast as the vapor deposition source crucible 93.

A pipe 194 is connected to the vapor deposition source 191 at an end (supply-side end) where one end of the line of the injection holes 192 is located. Vapor deposition particles supplied to the vapor deposition source 191 are injected from the injection holes 192.

The rotation mechanism 200a and the rotation mechanism 200b are configured to rotate the vapor deposition source unit 190a and the vapor deposition source unit 190b, respectively. The rotation mechanism 200a and the rotation mechanism 200b have the same configuration, and each include a rotation motor 201 and a rotation shaft 202. In each of the vapor deposition source units 190a and 190b, the vapor deposition source 191 and the vapor deposition source crucible 193 are connected to one end and the other end of a U-shaped support stick 195, respectively. Further, a center portion of the support stick 195 is connected to the rotation shaft 202 which is to be rotated by the rotation motor 201. According to this arrangement, when the rotation motor 201 of each of the rotation mechanisms 200a and 200b rotates the rotation shaft 202, the vapor deposition source 191 and the vapor deposition source crucible 193 rotate so that their rotation axes are perpendicular to the film formation substrate 60.

Note that the rotation motor 201 can be provided outside the vacuum chamber and configured to rotate a corresponding one of the vapor deposition source units 190a and 190b inside the vacuum chamber via the rotation shaft 202.

A described above, the vapor deposition device 150 in accordance with the present embodiment includes two vapor deposition source units and two rotation mechanisms. As is the case with the vapor deposition device 50 in accordance with Embodiment 1, the vapor deposition device 150 is also configured such that the direction of the line of the injection holes 192 is reversed according to the direction in which the film formation substrate 60 is scanned.

Specifically, first, the vapor deposition source 191 in each of the vapor deposition source units is positioned in such a position that its part connected to the pipe 194 is located on the left side of FIG. 10. Note here that the injection holes 192 of each of the vapor deposition sources 191 of the vapor deposition source units 190a and 190b are arranged in the same direction. In this state, vapor deposition particles are supplied via the pipe 194 to the vapor deposition source 191 (vapor deposition supplying step), and, while the film formation substrate 60 is being scanned away from a viewer of FIG. 10 (such a direction is referred to as a forth direction), the vapor deposition particles are injected from the injection holes 192 towards the film formation substrate 60 (first injecting step).

After the scanning in the forth direction (i.e. when the film formation substrate 60 reached a position where it does not face the vapor deposition source 191), each of the rotation mechanisms 200a and 200b rotates its corresponding vapor deposition source 191 by 180 degrees so as to reverse the direction in which the injection holes 192 are arranged (rotating step). This causes the part connected to the pipe 194 to be located on the right side of the drawing (see FIG. 11). In this state, vapor deposition particles are injected from the injection holes 192 towards the film formation substrate 60 while the film formation substrate 60 is being scanned back toward the viewer of FIG. 11 (such a direction is referred to as a back direction) (second injecting step). After the scanning in the back direction, injection of vapor deposition particles is stopped.

FIG. 12 is a graph illustrating a relationship between (i) positions on the film formation substrate 60 along a direction in which the injection holes 192 are arranged and (ii) distribution (thickness) of vapor deposition particles. It is assumed in this graph that (i) a position which faces a supply-side end of the vapor deposition source 191 of the vapor deposition source unit 190a on the left side of FIG. 10 is a position A and (ii) a position which faces an end opposite to a supply-side end of the vapor deposition source 191 of the vapor deposition source unit 190b is a position B. A solid line in the graph shows distribution of vapor deposition particles deposited in a case where the film formation substrate 60 is scanned in the forth direction, whereas a dashed line shows distribution of vapor deposition particles deposited in a case where the film formation substrate 60 is scanned in the back direction. Further, a dot-dash line shows distribution of vapor deposition particles after the completion of the scanning in the back and forth directions.

As shown by the solid line, when the film formation substrate 60 is scanned in the forth direction, film thickness of vapor deposition particles monotonically decreases from the position A to an intermediate position between the position A and the position B, and then increases at the intermediate position. This is because the intermediate position corresponds to the supply-side end of the vapor deposition source 191 of the vapor deposition source unit 190b shown in FIG. 10. Further, since vapor deposition particles flow from two adjacent vapor deposition sources 191 to an intermediate position between the position A and the position B, the distribution of the vapor deposition particles in the intermediate position is in the form of a wave.

As shown by the dashed line, when the film formation substrate 60 is scanned in the back direction, the film thickness of the vapor deposition particles monotonically increases from the position A to the intermediate position between the position A and the position B, and then decreases at the intermediate position. In other words, the distribution shown by the dashed line is reverse, with respect to the intermediate position, to that shown by the solid line.

The film thickness distribution after the completion of the scanning of the film formation substrate 60 in the back and forth directions is a sum of the film thickness distribution shown by the solid line and the film thickness distribution shown by the dashed line. Therefore, as shown by the dot-dash line, the film thickness distribution after the completion of the scanning of the film formation substrate 60 in the back and forth directions is uniform in comparison with the film thickness distribution obtained when the scanning is carried out in the forth direction and that obtained when the scanning is carried out in the back direction.

Further, a comparison between FIGS. 4 and 12 shows that the film thickness shown by the dot-dash line in FIG. 12 is more uniform than the film thickness distribution shown by the dot-dash line in FIG. 4. That is, since the present embodiment is arranged such that a vapor deposition source of Embodiment 1 is divided into a plurality of vapor deposition sources, the length of each of the vapor deposition sources is shorter than that of the vapor deposition source of Embodiment 1. Therefore, each of the vapor deposition sources causes less nonuniformity in the film thickness. Accordingly, film thickness distribution obtained as a result of combining (i) the film thickness distribution obtained when the film formation substrate 60 is scanned in the forth direction and (ii) the film formation distribution obtained when the film formation substrate 60 is scanned in the back direction also has less nonuniformity, whereby the film thickness becomes more uniform across the surface of the substrate.

Although the present embodiment employs two vapor deposition sources, three or more vapor deposition sources can be provided. A larger number of vapor deposition sources make the film thickness distribution more uniform. Note, however, that a vapor deposition source crucible is required for each of the vapor deposition sources, and unevenness in distribution of vapor deposition particles which are injected from the vapor deposition sources affects the film thickness distribution. Further, the number of mechanisms for rotating the vapor deposition sources also increases, thereby imposing more limitations on the design of the device. Therefore, it is preferable to determine the number of the vapor deposition sources in consideration of advantages and disadvantages of such a number of the vapor deposition sources. For example, the number of the vapor deposition sources is preferably two to four.

The plurality of vapor deposition sources do not necessarily have the same size. Note however that, since vapor deposition sources of different sizes are different in distribution of vapor deposition particles, the vapor deposition sources of different sizes may not be able to achieve sufficient uniformity in the film thickness distribution obtained as a result of combining (i) the film thickness distribution obtained when the film formation substrate is scanned in the forth direction and (ii) the film thickness distribution obtained when the film formation substrate is scanned in the back direction. Therefore, the vapor deposition source units, in particular the vapor deposition sources, preferably have the same size.

Further, the vapor deposition source can be rotated at different times. Note however that, for example in a case where the vapor deposition source units are structured such that rotating of the vapor deposition sources at different times causes spatial interference, it is preferable to rotate the vapor deposition source at the same time.

Besides, the vapor deposition device in accordance with the present embodiment brings about the same effects as the vapor deposition device of Embodiment 1.

[Additional Matters]

In the foregoing embodiments, a line-type vapor deposition source on which injection holes are arranged in a line is employed. Note however, that a planar vapor deposition source on which there is a plurality of lines of injection holes can also be employed. Further, in a case where an injection surface of a vapor deposition source is sufficiently large and a film formation substrate is relatively small, vapor deposition can be carried out without moving the film formation substrate relative to the vapor deposition source.

Furthermore, although the foregoing embodiments deal with an arrangement in which the direction in which the injection holes are arranged is perpendicular to the direction in which the film formation substrate is to be scanned, the direction in which the injection holes are arranged can deviate to some degree from the direction perpendicular to the direction in which the film formation substrate is to be scanned.

Furthermore, although the foregoing embodiments deal with an arrangement in which each of the injection holes has a point shape, this does not imply any limitation. The injection holes can be, for example, a slit-like opening extending along the direction in which the injection holes are arranged.

Further, the present invention is also applicable to a close-contact-scanning vapor deposition method by which to carry out vapor deposition by sliding a film formation substrate while keeping the film formation substrate and a shadow mask in close contact to each other. Furthermore, the present invention is also applicable to a case where, as shown in S2 and S4 through S6 of FIG. 9, vapor deposition is carried out with respect to the entire surface of the film formation substrate without using a shadow mask.

Moreover, the present invention is applicable not only to vapor deposition of organic films but also to vapor deposition of second electrodes and sealing films. Note however that, since unevenness in film thickness of an organic film has a larger impact on the properties of an organic EL display device, the present invention is more effective for vapor deposition of the organic film.

On the other hand, unevenness in film thickness of a second electrode leads to unevenness in electric resistance, whereas unevenness in the sealing film leads to unevenness in moisture permeability and oxygen permeability. Provided that the influences of such unevenness on the properties of an organic EL element are minor, the present invention can be applied only to vapor deposition of organic films so that the structure of a vapor deposition device is simple and thus no increase occurs in cost of equipment.

Furthermore, although the foregoing embodiments deal with an arrangement in which the rotation motor rotates an entire vapor deposition source unit including the vapor deposition source and the vapor deposition source crucible, the rotation motor can be configured to rotate only the vapor deposition source. In this case, it is only necessary that the vapor deposition source crucible be fixed and that the vapor deposition source and the vapor deposition source crucible be connected via a rotatable pipe. In a case where there are provided a plurality of vapor deposition sources, the vapor deposition sources can be configured to be rotated by a single rotation motor.

<Main Point of the Invention>

As has been described, a vapor deposition device in accordance with one or more embodiments of the present invention is a vapor deposition device for forming a film on a film formation substrate, including: a vapor deposition source which has a plurality of injection holes from which vapor deposition particles are to be injected towards the film formation substrate, the plurality of injection holes being arranged in a line or in a plurality of lines; vapor deposition particle supplying means for supplying the vapor deposition particles to the vapor deposition source via a pipe, the pipe being connected to the vapor deposition source on a side where one end of the line(s) of the plurality of injection holes is located; and rotating means for rotating the vapor deposition source.

As has been described, a vapor deposition method in accordance with one or more embodiments of the present invention is a vapor deposition method for forming a film on a film formation substrate, including the steps of: (a) supplying, via a pipe, vapor deposition particles to a vapor deposition source which has a plurality of injection holes arranged in a line or in a plurality of lines, the pipe being connected to the vapor deposition source on a side where one end of the line(s) of the injection holes is located; (b) injecting the vapor deposition particles from the injection holes towards the film formation substrate; (c) rotating, after the step (b), the vapor deposition source so as to reverse a direction in which the injection holes are arranged; and (d) injecting, after the step (c), the vapor deposition particles from the injection holes towards the film formation substrate.

According to the vapor deposition device and the vapor deposition method, the vapor deposition particles are supplied to the vapor deposition source via the pipe from the vapor deposition particle supplying means, and injected from the injection holes towards the film formation substrate. Since the pipe is connected to the vapor deposition source on the side where one end of the line(s) of the injection holes is located, the amount of vapor deposition particles to be injected from the injection holes monotonically decreases with increasing distance from the one end. In view of the circumstances, after vapor deposition particles are injected from the injection holes towards the film formation substrate, the vapor deposition source is rotated so that the direction in which the injection holes are arranged is reversed, and then vapor deposition particles are injected from the injection holes towards the film formation substrate again. With this, film thickness distribution of vapor deposition particles deposited before the reverse and that after the reverse are symmetrical about the center of the substrate. Accordingly, film thickness distribution which is a combination of (a) the film thickness distribution of vapor deposition particles deposited before the reverse and (b) the film thickness distribution of vapor deposition particles deposited after the reverse is more uniform than that obtained in a case where the vapor deposition is carried out without rotating the vapor deposition source. As such, it is possible to provide a vapor deposition device and a vapor deposition method each of which is capable of vapor deposition of vapor deposition particles on a film formation substrate such that a film made of the vapor deposition particles has a uniform thickness.

The vapor deposition device in accordance with one or more embodiments of the present invention is preferably configured such that a rotation axis of the vapor deposition source is perpendicular to the film formation substrate.

According to the configuration, an injection surface of the vapor deposition source is parallel with the film formation substrate. This makes it possible to cause vapor deposition particles to be deposited so that deposited particles has a more uniform film thickness.

The vapor deposition device in accordance with one or more embodiments of the present invention is preferably configured such that: relative positions of the vapor deposition source and the vapor deposition particle supplying means are fixed; and the rotating means rotates the vapor deposition particle supplying means and the vapor deposition source together.

According to the configuration, the relative positions of the vapor deposition source and the vapor deposition particle supplying means are fixed. This allows for the use of a pipe having a simple structure to connect the vapor deposition source with the vapor deposition particle supplying means.

It is preferable that the vapor deposition device in accordance with one or more embodiments of the present invention includes a plurality of the vapor deposition sources.

According to the configuration, since the plurality of the vapor deposition sources are provided, the length of each of the vapor deposition sources is short. Therefore, each of the vapor deposition sources causes less nonuniformity in the film thickness distribution, whereby nonuniformity in the film thickness distribution further decreases.

The vapor deposition device in accordance with one or more embodiments of the present invention is preferably configured such that the number of the plurality of vapor deposition sources is two to four.

According to the configuration, it is possible to cause the vapor deposition particles to be deposited such that deposited vapor deposition particles have a more uniform film thickness, without the need to make the vapor deposition device have a very complicated structure.

The vapor deposition device in accordance with one or more embodiments of the present invention is preferably configured such that the plurality of vapor deposition sources have the same size.

According to the configuration, the plurality of vapor deposition sources achieve the same distribution of vapor deposition particles. This makes it possible to obtain a sufficiently uniform film thickness distribution.

The vapor deposition device in accordance with one or more embodiments of the present invention is preferably configured such that the rotating means rotates the plurality of vapor deposition sources at the same time.

According to the configuration, even in a case where the plurality of vapor deposition sources spatially interfere with each other when rotated at different times, the plurality of vapor deposition sources can be rotated without any problems.

It is preferable that the vapor deposition device in accordance with one or more embodiments of the present invention includes a plurality of groups each including the vapor deposition source and the vapor deposition particle supplying means, relative positions of the vapor deposition source and the vapor deposition particle supplying means being fixed, and the rotating means rotating the vapor deposition particle supplying means and the vapor deposition source together.

According to the configuration, the relative positions of the vapor deposition source and the vapor deposition particle supplying means are fixed. This allows for the use of a pipe having a simple structure to connect the vapor deposition source with the vapor deposition particle supplying means.

The vapor deposition device in accordance with one or more embodiments of the present invention is preferably configured such that, while the vapor deposition particles are injected from the vapor deposition sources towards the film formation substrate, the lines of the plurality of injection holes in the vapor deposition sources are in the same direction.

According to the configuration, it is possible to achieve a further uniform film thickness distribution in a direction perpendicular to the direction in which the injection holes are arranged.

It is preferable that the vapor deposition device in accordance with one or more embodiments of the present further includes moving means for moving the film formation substrate relative to the vapor deposition source(s).

According to the configuration, it is possible to easily form a film on the film formation substrate which has a large vapor deposition region than the injection surface of the vapor deposition source.

The vapor deposition device in accordance with one or more embodiments of the present invention is preferably configured such that, while the vapor deposition particles are injected from the vapor deposition source(s) towards the film formation substrate, the line(s) of the plurality of injection holes is/are perpendicular to a direction in which the film formation substrate is moved.

According to the configuration, it is possible to easily carry out alignment of the vapor deposition source and the film formation substrate.

A method for producing organic electroluminescent display device in accordance with one or more embodiments of the present invention includes the steps of: (A) forming a first electrode on a TFT substrate; (B) depositing, over the TFT substrate, an organic layer including at least a luminescent layer; (C) depositing a second electrode; and (D) sealing, with a sealing member, an organic electroluminescent element including the organic layer and the second electrode, at least one of the steps (B), (C) and (D) including the steps (a), (b), (c) and (d) of the above vapor deposition method.

According to the arrangement, it is possible, by a vapor deposition method of one or more embodiments of the present invention, to form an organic layer etc. that has a uniform film thickness. Therefore, it is possible to provide an organic electroluminescent display device which causes less display unevenness.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The present invention is applicable not only to vapor deposition of vapor deposition particles in production of an organic EL display device, but also to vapor deposition of vapor deposition particles onto any target.

REFERENCE SIGNS LIST

1 Organic EL display device (Organic electroluminescent display device)
2 Pixel
2B Sub-pixel
2G Sub-pixel
2R Sub-pixel
10 TFT substrate
11 Insulating substrate
12 TFT
13 Interlayer film
13a Contact hole
14 Wire
15 Edge cover
15R Opening
15G Opening
15B Opening
20 Organic EL element
21 First electrode
22 Hole injection layer/hole transfer layer
23R Luminescent layer
23G Luminescent layer
23B Luminescent layer
24 Electron transfer layer
25 Electron injection layer
26 Second electrode
30 Adhesive layer
40 Sealing substrate
50 Vapor deposition device
60 Film formation substrate
80 Shadow mask
90 Vapor deposition source unit
91 Vapor deposition source
92 Injection hole
93 Vapor deposition source crucible (Vapor deposition particle supplying means)
94 Pipe
95 Support stick
100 Rotation mechanism (Rotating means)
101 Rotation motor
102 Rotation shaft
150 Vapor deposition device
180 Shadow mask
181 Opening 190a Vapor deposition source unit
190b Vapor deposition source unit
191 Vapor deposition source
192 Injection hole
193 Vapor deposition source crucible (Vapor deposition particle supplying means)
194 Pipe
195 Support stick
200a Rotation mechanism (Rotating means)
200b Rotation mechanism (Rotating means)
201 Rotation motor
202 Rotation shaft
250 Vapor deposition device
260 Film formation substrate
280 Shadow mask
290 Vapor deposition source unit
291 Vapor deposition source
292 Injection hole
293 Vapor deposition source crucible
294 Pipe

The invention claimed is:

1. A vapor deposition method for forming a film on a film formation substrate, comprising the steps of:
 (a) supplying, via a pipe, vapor deposition particles to a vapor deposition source which has a plurality of injection holes arranged in a line or in a plurality of lines, the pipe being connected to the vapor deposition source on a side where one end of the line(s) of the plurality of injection holes is located;
 (b) injecting the vapor deposition particles from the injection holes towards the film formation substrate, wherein the vapor deposition particles are deposited while the film formation substrate is scanned in a forth direction;
 (c) rotating, after the step (b), the vapor deposition source so as to reverse a direction in which the plurality of injection holes are arranged; and
 (d) injecting, after the step (c), the vapor deposition particles from the injection holes towards the film formation substrate,
 a rotation axis of the vapor deposition source (i) being perpendicular to the film formation substrate and (ii) being provided at a location which is in a direction toward a center of the vapor deposition source from a connection of the pipe and the vapor deposition source, wherein the vapor deposition particles are deposited while the film formation substrate is scanned in a back direction.

2. A method for producing an organic electroluminescent display device, comprising the steps of:
 (A) forming a first electrode on a TFT substrate;
 (B) depositing, over the TFT substrate, an organic layer including at least a luminescent layer;
 (C) depositing a second electrode; and
 (D) sealing, with a sealing member, an organic electroluminescent element including the organic layer and the second electrode,
 at least one of the steps (B), (C) and (D) including the steps (a), (b), (c) and (d) of the vapor deposition method recited in claim 1.

3. The method as set forth in claim 1, wherein:
 in the steps (b) and (d), the vapor deposition particles are sequentially deposited onto a vapor deposition region of the film formation substrate via an opening of a shadow mask by moving the film formation substrate relative to the shadow mask and to the vapor deposition source with a certain gap between the shadow mask and the film formation substrate, the shadow mask having an area smaller than the vapor deposition region.

4. The method as set forth in claim 3, wherein:
 in the steps (b) and (d), the shadow mask and the film formation substrate are positioned so that the shadow mask faces the film formation substrate with the certain gap.

* * * * *